US006740551B2

(12) United States Patent
Yoshida et al.

(10) Patent No.: US 6,740,551 B2
(45) Date of Patent: May 25, 2004

(54) METHOD OF MANUFACTURING A SEMICONDUCTOR INTEGRATED CIRCUIT

(75) Inventors: Yoshifumi Yoshida, Chiba (JP); Miwa Wake, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/236,391

(22) Filed: Sep. 6, 2002

(65) Prior Publication Data
US 2003/0054594 A1 Mar. 20, 2003

(51) Int. Cl.⁷ .......................................... H01L 21/8238
(52) U.S. Cl. ..................................... 438/199; 438/479
(58) Field of Search ................................ 438/155, 300, 438/199, 479

(56) References Cited

U.S. PATENT DOCUMENTS

| | | | | |
|---|---|---|---|---|
| 5,119,155 A | * | 6/1992 | Hieda et al. ............... | 357/23.6 |
| 5,618,745 A | * | 4/1997 | Kita ........................... | 438/164 |
| 6,207,494 B1 | * | 3/2001 | Graimann et al. ......... | 438/248 |
| 6,352,882 B1 | * | 3/2002 | Assaderaghi et al. ..... | 438/155 |
| 6,358,785 B1 | * | 3/2002 | Chittipeddi et al. ...... | 438/174 |

* cited by examiner

Primary Examiner—John F. Niebling
Assistant Examiner—Christopher Lattin
(74) Attorney, Agent, or Firm—Adams & Wilks

(57) ABSTRACT

A semiconductor integrated circuit is provided in which a change in timing of a circuit or variation in a driving ability do not occur even if the potential of a support substrate is fixed. The method of manufacturing a semiconductor integrated circuit according to the present invention includes: forming a contact hole in a source-body-tie region of a transistor so that the contact hole reaches a part of the support substrate through a semiconductor film and a buried insulating film on the support substrate; forming a thermal oxide film; forming an impurity region of a second conductivity in a region where a transistor of a first conductivity is to be formed, which reaches the buried insulating film on the semiconductor film; forming an impurity region of a second conductivity in a portion on the support substrate and opposing the impurity region of a second conductivity with respect to the insulating film; and etching an interlayer insulating film so as to be concentric with the contact hole and to have a size surrounding the contact hole.

2 Claims, 7 Drawing Sheets

METHOD OF MANUFACTURING A SEMICONDUCTOR INTEGRATED CIRCUIT

BACKGROUND OF THE INVENTION

1. Field of the Invention

The present invention relates to a method of manufacturing a transistor having a structure that prevents the potential of a support substrate under a buried insulating film from greatly affecting the characteristics of a transistor formed on a SOI wafer. In particular, the present invention relates to a so-called source-body-tie transistor in which a source-body-tie region is provided in the vicinity of a source region of a transistor.

2. Description of the Related Art

FIGS. 5A to 5D and FIGS. 6A to 6C illustrate a method of manufacturing a conventional SOI transistor, and FIGS. 7A and 7B are a structural plan view and a cross-sectional view of the conventional SOI transistor. Herein, a transistor is formed by using a wafer in which a P-type semiconductor film 51 is formed on a P-type support substrate via a buried insulating film. The conventional SOI transistor is formed in the semiconductor film 51 in a region surrounded by a LOCOS 58 reaching the buried insulating film as shown in FIGS. 7A and 7B, and each transistor is completely isolated by the LOCOS 58. In the case of an N-type transistor, since the semiconductor film 51 is of a P-type, a transistor is formed by implanting N-type ions into source/drain regions 64 and 76. On the other hand, in the case of a P-type transistor, a transistor is formed by implanting N-type ions into the semiconductor film 51 surrounded by the LOCOS 58, and implanting P-type ions into source/drain regions 63 and 75 under the condition that the semiconductor film 51 is kept in an N-type. According to the manufacturing method, as shown in FIGS. 5A to 5D, patterning and etching are conducted first so as to imprint an alignment mark on a wafer and a thermal oxide film 54 is formed, and a resist 56 is applied thereto. Then, alignment and exposure to light are conducted, and patterning for the purpose of implanting a well is conducted. Next, ions are implanted using the resist 6 as a mask to form a well 55. At this time, the energy of ion implantation is controlled so that the semiconductor can have the peak of a concentration distribution. Then, a heat treatment is conducted, whereby the implanted ions are activated and diffused. Then, a nitride film 57 is formed, patterned, and thermally oxidized to form a LOCOS 58. At this time, thermal oxidation is conducted so that the LOCOS 58 reaches the buried insulating film 52. After forming the LOCOS 58, a gate oxide film 59 is formed, a gate electrode 60 is formed, and ions are implanted into source/drain regions 63, 64, 75 and 76 of the transistor and source-body-tie regions 61 and 62, whereby an interlayer insulating film 70 is formed. The interlayer insulating film 70 is patterned and etched to form contacts of the gate electrode 60, the source/drain regions 63, 64, 75 and 76, and the source-body-tie regions 61 and 62.

The insulating film 52 is disposed between the support substrate 53 and the semiconductor film 51, so that the potential of the support substrate 53 is floated. In the SOI transistor, the potential of the support substrate 53 affects the characteristics of a transistor, so that it is required to fix the potential of the support substrate 53. The potential of the support substrate 53 is set as follows: the support substrate 53 is attached to a conductive base by a conductive adhesive when being mounted in a package, and the potential is taken from the base. Generally, the support substrate is connected to a ground terminal or a power source voltage terminal.

There is also another method of taking the potential of the support substrate side from the semiconductor film side. Specifically, a through-hole is provided so as to reach a part of the support substrate 53 through the semiconductor film 51 and the buried insulating film 52, thereby taking a potential. In this case, in the same way as in the method of taking a substrate potential of a bulk transistor, a contact is provided on the periphery of the transistor, and the potential of the support substrate 53 is taken.

According to the conventional method of forming an SOI transistor, since there is a buried insulating film between a support substrate and a semiconductor film, a transistor on the semiconductor film is not electrically connected to the support substrate, and the potential of the support substrate is floated. However, in a complete depletion type SOI transistor and the like, a semiconductor film is entirely depleted in the thickness direction and depletion reaches a buried insulating film. Therefore, the potential of the support substrate greatly affects the characteristics of the transistor, and a change in potential of the support substrate exhibits the same characteristics as that of a back gate effect of a bulk transistor.

Therefore, it is required to fix the potential of the support substrate. Generally, according to the method of fixing the potential of the support substrate, the support substrate is attached to a conductive base by a conductive adhesive when being mounted in a package, and the potential of the base is fixed, whereby the potential of the support substrate is fixed. The potential of the support substrate is connected to a ground terminal or a power source voltage terminal.

In the case where the potential of the support substrate is fixed by the above-mentioned connection method, all the back gate voltages of transistors formed on a semiconductor film on the support substrate become the same. Therefore, either of a P-type or an N-type transistor is supplied with a back gate voltage. For example, it is assumed that an inverter circuit is formed on a wafer composed of a P-type support substrate and a P-type semiconductor film. If it is assumed that the potential of the support substrate is set at a ground potential, the state of an N-type transistor of the inverter circuit becomes equal to the state where a back gate voltage is not supplied; however, the state of a P-type transistor thereof becomes equal to the state where a back gate voltage equivalent to a power source voltage is applied. Therefore, even if a threshold voltage and a current driving ability are combined in a circuit design, the threshold voltage of a transistor changes to a power source voltage, which brings about a change in timing of a circuit and variation in a driving ability.

Particularly in a voltage regulator and a voltage detector, even if a power source voltage is changed, it is required that a constant voltage is continuously output and constant voltage detection is kept. In the case where the above-mentioned SOI transistor is used in such an IC, there occurs a problem such that an output voltage fluctuates due to the fluctuation of a power source voltage, and a detection voltage fluctuates.

Furthermore, as a method of taking a potential of a support substrate side from a semiconductor film side, there is a method of taking a potential by providing a through-hole that reaches a part of the support substrate through a semiconductor film and a buried insulating film. In this case, a through-contact is provided in the vicinity of a transistor, and a power source voltage terminal is connected to a ground terminal to fix the potential of the support substrate. However, an original SOI device has a latch-up free structure. Therefore, it is not required to provide a guard ring of a transistor, which has the effect of reducing an area. However, according to a method of providing a through-contact on the periphery of a transistor so as to fix the potential of the support substrate, the effect of reducing an area of an SOI device is decreased.

Furthermore, according to the manufacturing method of providing a through-contact on the periphery of a transistor so as to fix the potential of a support substrate, it is required to form a through-hole that reaches a part of the support substrate through a semiconductor film and a buried insulating film, resulting in increase of the number of processes.

Furthermore, in an SOI transistor, there is a transistor in which a support substrate is considered as a gate electrode, and a buried insulating film is considered as a gate oxide film. Therefore, in a P-type transistor supplied with a back gate voltage as in an inverter circuit in the above-mentioned example, when a power source voltage is increased, a channel is formed at the interface of a semiconductor film and a buried insulating film, which disadvantageously allows a current to flow therethrough.

SUMMARY OF THE INVENTION

Therefore, with the foregoing in mind, it is an object of the present invention to provide a semiconductor integrated circuit in which even if the potential of a support substrate is fixed, a timing of a circuit is not changed and a driving ability is not varied.

According to the present invention, there is provided a method of manufacturing a semiconductor integrated circuit in which a CMOS transistor is formed on a semiconductor film of a first conductivity provided on a support substrate of a first conductivity via a buried insulating film, including:

forming a contact hole in a source-body-tie region adjacent to a body region under a source region and a gate region of a transistor so that the contact hole reaches a part of the support substrate through the semiconductor film and the buried insulating film on the support substrate, together with alignment marks;

forming a thermal oxide film on an inner side of the contact hole on the semiconductor film;

forming an impurity region of a second conductivity in a region where a transistor of a first conductivity is to be formed, which reaches the buried insulating film on the semiconductor film;

forming an impurity region of a second conductivity in a portion on the support substrate and opposing the impurity region of a second conductivity with respect to the insulating film;

forming a gate oxide film, a gate electrode, a source region, and a drain region after separating elements, and forming an interlayer insulating film;

forming contacts of the source region and the drain region, and simultaneously, etching the interlayer insulating film so as to be concentric with the contact hole and to have a size surrounding the contact hole; and forming wiring on the interlayer insulating film.

According to the above-mentioned method of the present invention, in a transistor formed on a semiconductor film, the potential of a source region becomes the same as that of a support substrate side at a position opposing the transistor with respect to a buried insulating film. This results in a structure in which a transistor of a first conductivity and a transistor of a second conductivity are not supplied with a back gate voltage, and a threshold voltage fluctuates due to the fluctuation of a power source voltage. This structure eliminates the inconvenience that the timing of a circuit is changed and a driving ability is varied. In particular, in a voltage regulator and a voltage detector, an output voltage is prevented from fluctuating due to the fluctuation of a power source voltage, and a detection voltage is prevented from being fluctuated.

Furthermore, in an SOI transistor according to the present invention, there is a transistor in which a support substrate is considered as a gate electrode, and a buried insulating film is considered as a gate oxide film. Therefore, in a P-type transistor supplied with a back gate as in an inverter circuit in the above-mentioned example, when a power source voltage is increased, a channel is formed at the interface of a semiconductor film and a buried insulating film, which disadvantageously allows a current to flow therethrough. However, in the SOI transistor according to the present invention, a back gate is not applied. This eliminates the inconvenience that when a power source voltage is increased, a channel is formed at the interface of a semiconductor film and a buried insulating film, which disadvantageously allows a current to flow therethrough.

Furthermore, in the SOI transistor according to the present invention, a through-contact to a support substrate is provided in a source-body-tie region. Therefore, the area of an SOI device can be effectively reduced. Furthermore, a through-contact according to the present invention is formed simultaneously with the formation of an alignment mark. Therefore, compared with the conventional process of forming a through-contact to a support substrate, there is an effect of reducing the number of processes.

These and other advantages of the present invention will become apparent to those skilled in the art upon reading and understanding the following detailed description with reference to the accompanying figures.

DESCRIPTION OF THE PREFERRED EMBODIMENTS

Figure 4A:
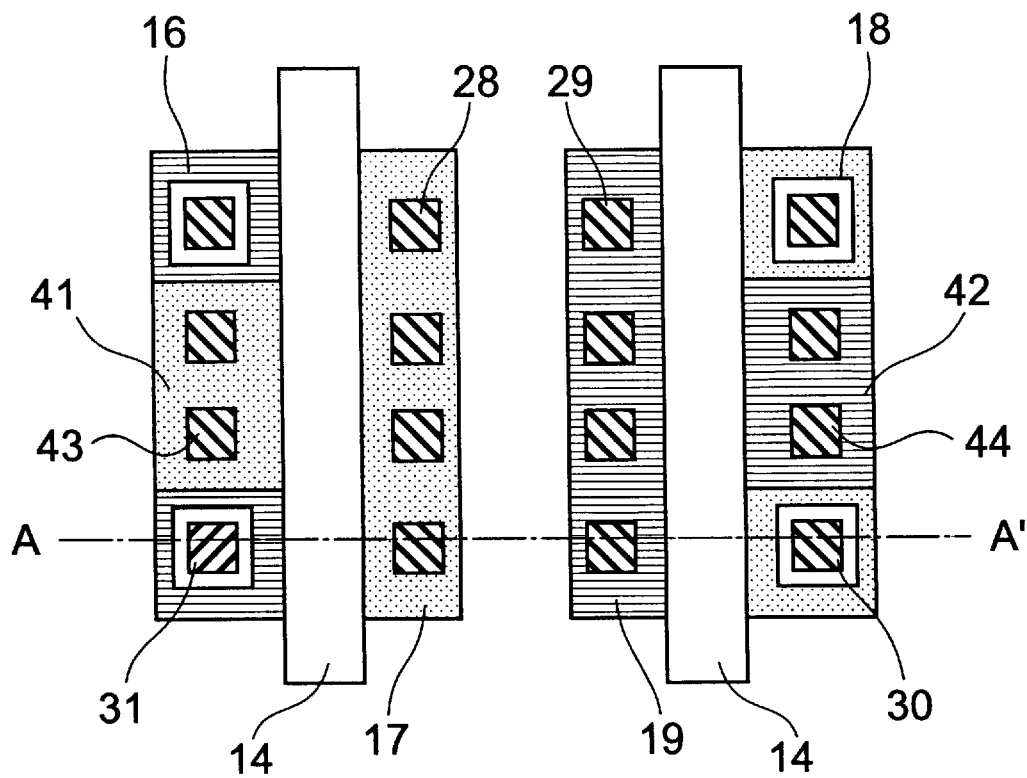
FIGS. 4A and 4B are a top view and a cross-sectional view showing a structure of a transistor manufactured by the manufacturing method of the present invention.
Figure 4B:
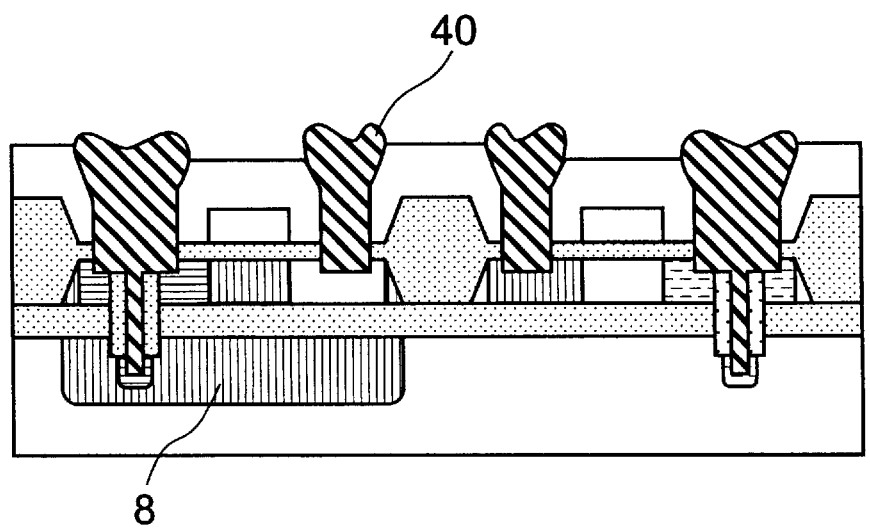
Figure 5A:
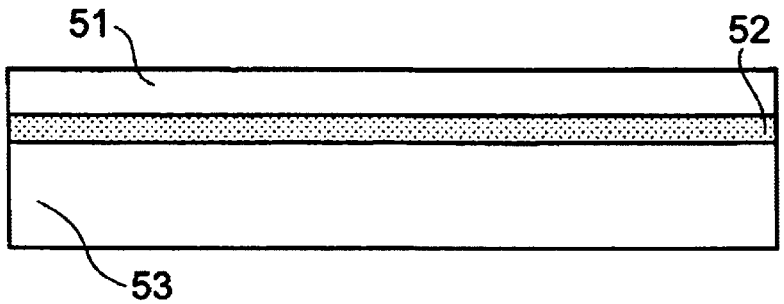
FIGS. 5A to 5D are views illustrating a process flow of a conventional manufacturing method.
Figure 5B:
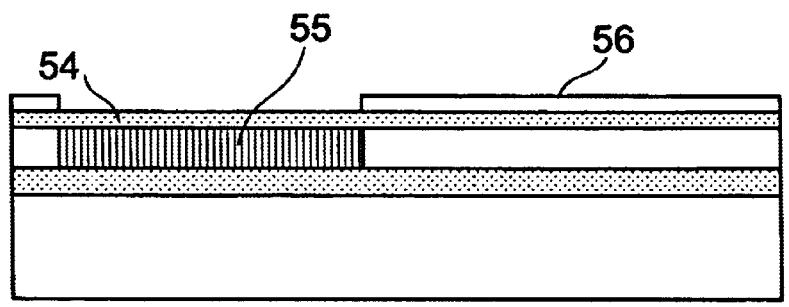
Figure 5C:
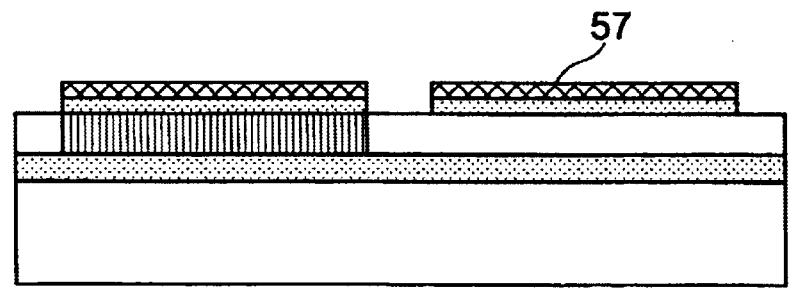
Figure 5D:
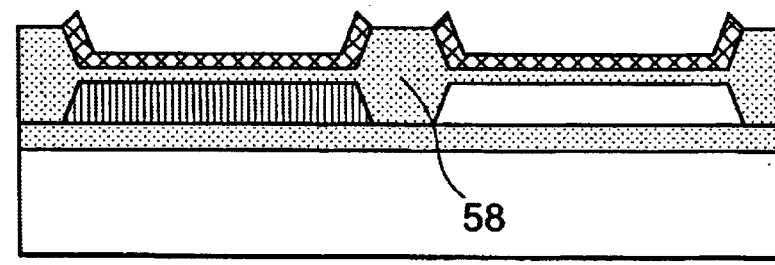
Figure 6A:
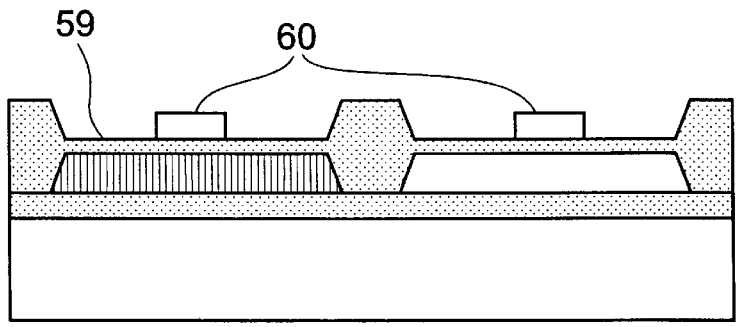
FIGS. 6A to 6C are views illustrating a process flow of the conventional manufacturing method.
Figure 6B:
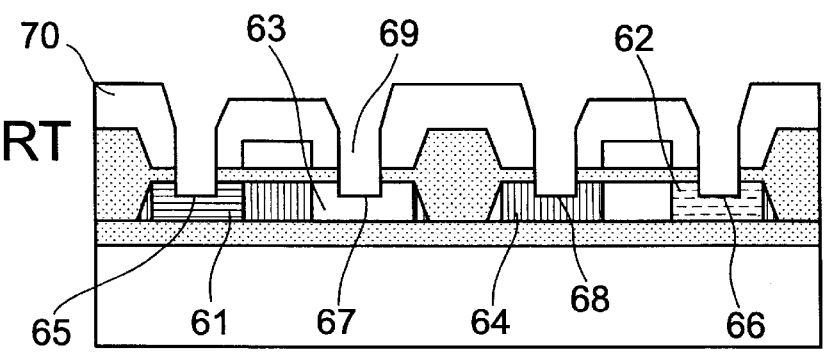
Figure 6C:
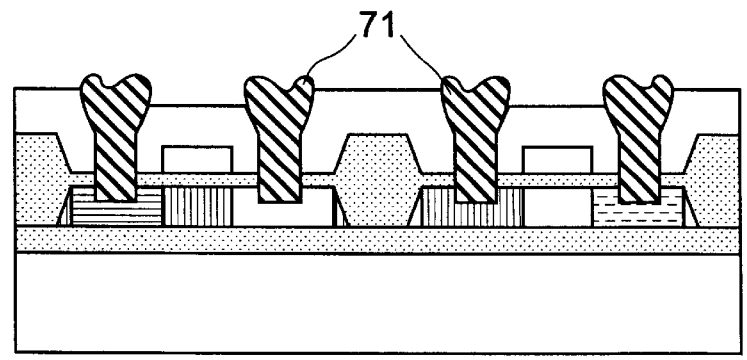
Figure 7A:
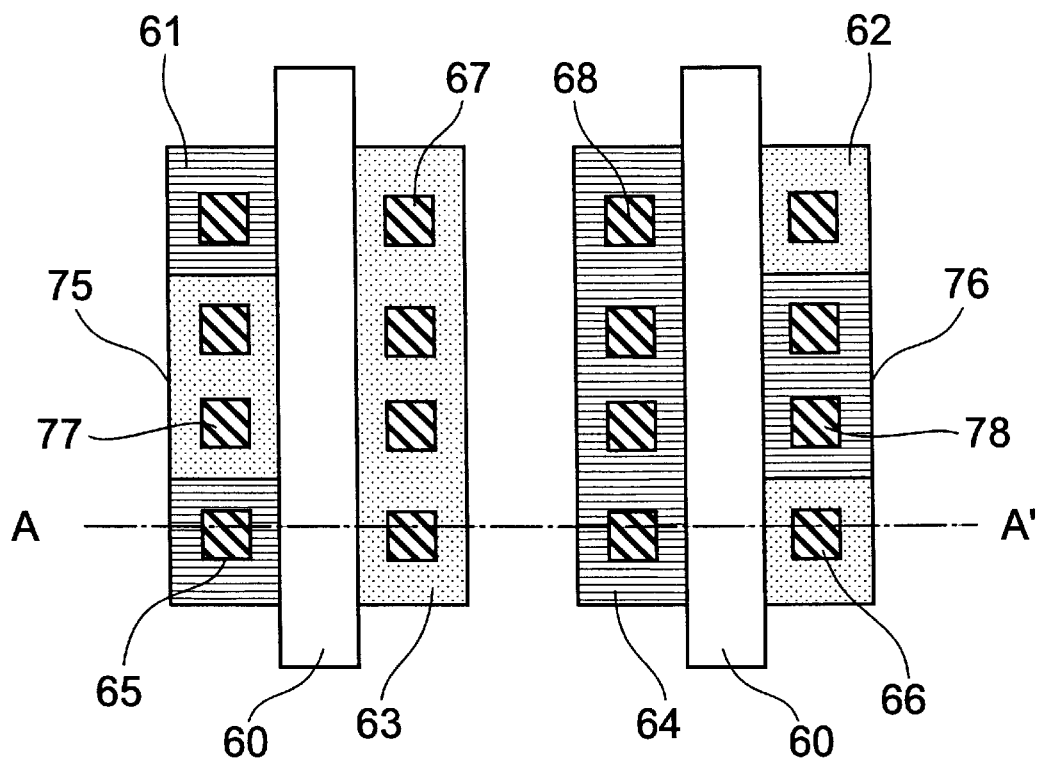
FIGS. 7A and 7B are a top view and a cross-sectional view showing a structure of a transistor manufactured by the conventional manufacturing method.
Figure 7B:
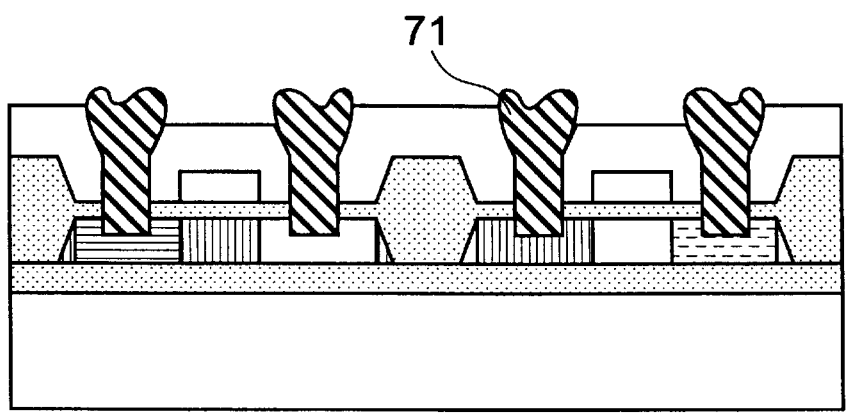

The present invention will be described by way of an embodiment with reference to FIGS. 1A to 1E to 4A and 4B. A transistor described in the present invention has a source-body-tie structure, as shown in a top view of FIG. 4A. In this top view, wiring 40 is not shown. A cross-sectional view of the transistor in FIG. 4B is taken along a line A–A' in FIG. 4A, so that source-body-tie regions 16 and 18 and drain regions 17 and 19 are shown.

In a method of manufacturing a semiconductor integrated circuit described in an embodiment of the present invention, a method of forming an N-type transistor and a P-type transistor on a P-type semiconductor film formed on a P-type support substrate via a buried oxide film will be described. However, this also applies to a method of forming a transistor on an N-type semiconductor film formed on an N-type support substrate via a buried oxide film.

Hereinafter, a method of manufacturing a semiconductor integrated circuit according to the present invention will be described.

Figure 1A:
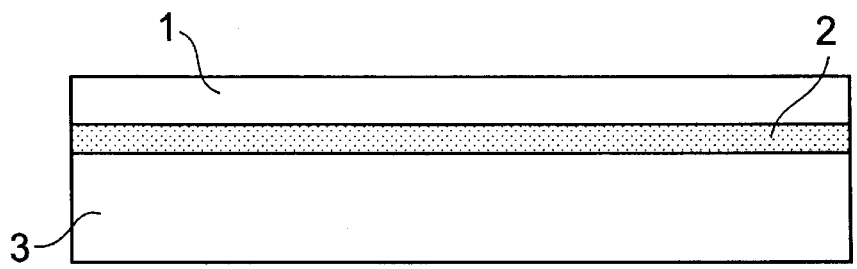
FIGS. 1A to 1E are views illustrating a process flow of a manufacturing method of the present invention.
Figure 1B:
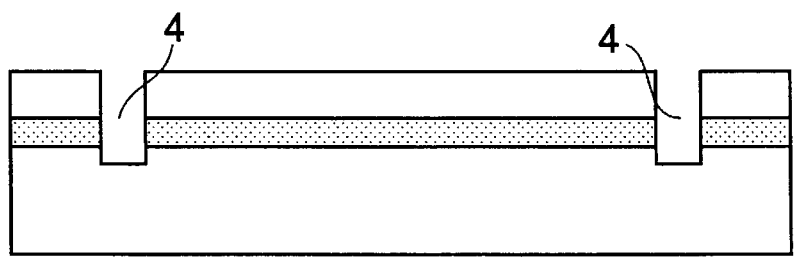

As shown in FIG. 1A, a SOI wafer having a semiconductor film 1 (thickness: 200 Å to 3000 Å) provided on a support substrate 3 via a buried insulating film 2 is patterned. Contact holes 4 are formed in the SOI wafer so as to reach a part of the support substrate 3 through the semiconductor film 1 and the buried insulating film 2 by dry etching or wet etching. Although not shown in FIG. 1B, alignment marks are also formed so as to reach a part of the support substrate 3 through the semiconductor film 1 and the buried insulating film 2, simultaneously with the formation of the contact holes 4. An example of a method of forming alignment marks includes forming a step difference using a thermal oxidation process. In the SOI wafer having the semiconductor film 1 (thickness: 200 Å to 3000 Å) as in the present invention, it may be considered that alignment marks are lost in the course of manufacturing of a CMOS. In order to avoid this, it is required to form alignment marks reaching the support substrate 3. Thus, the present invention is characterized in that the contact holes 4 and the alignment marks are formed simultaneously.

Figure 1C:
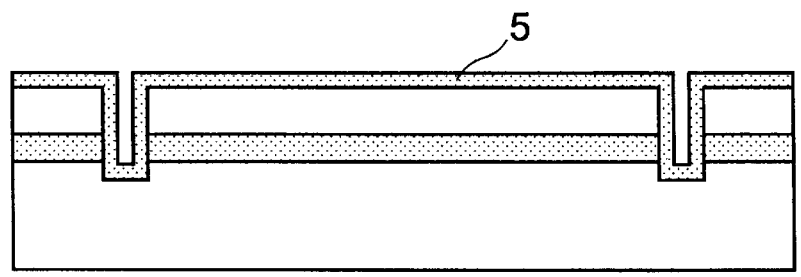

Next, a thermal oxide film 5 with a thickness of about 100 Å is formed (FIG. 1C). The thermal oxide film 5 is formed for the purpose of forming a nitride film 10 in the next process, reducing a damage to the substrate when ions for wells are implanted, and preventing a solution from coming into contact with silicon (support substrate 3 and semiconductor film 1) when the nitride film 10 is removed after a LOCOS 13 is formed. In general, the thermal oxide film 5 is formed first in the process of manufacturing a CMOS. However, the manufacturing method of the present invention is characterized in that the thermal oxide film 5 is formed after forming the contact holes 4. If the contact holes 4 are formed after forming the thermal oxide film 5, silicon is exposed in the contact holes 4 in the subsequent processes. Therefore, inconvenience is caused during formation of the nitride film 10, the substrate is damaged while implanting ions for wells, a solution comes into contact with silicon (support substrate 3 and semiconductor film 1) when the nitride film 10 is removed after the LOCOS 13 is formed, and the like. Therefore, it is important that the contact holes 4 are formed before forming the thermal oxide film 5.

Figure 1D:
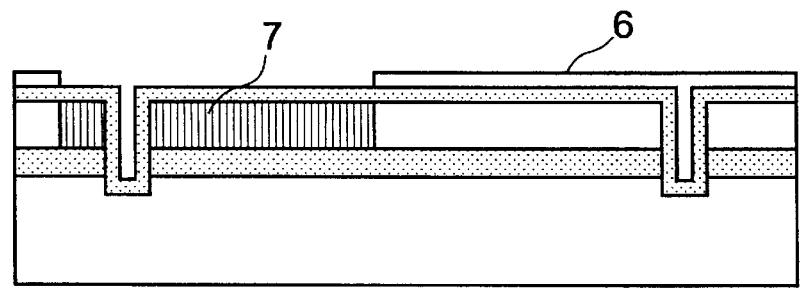

Then, patterning is conducted with a resist 6 on the thermal oxide film 5, and openings for implanting ions for a well 7 is formed. As shown in FIG. 1D, ions are implanted through the thermal oxide film 5 using the resist 6 as a mask. Because of this, the ions are implanted into only the openings of the resist 6. At this time, the energy of ion implantation is adjusted so that the peak of a concentration distribution is obtained in the semiconductor film 1.

Figure 1E:
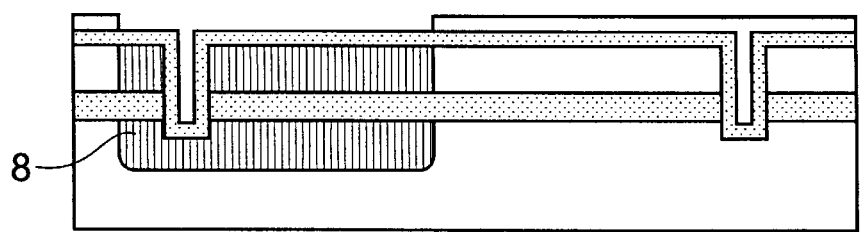

Next, as shown in FIG. 1E, ions for a second well 8 is implanted into the support substrate 3 opposing the well 7 with the buried insulating film 2 interposed therebetween, using the same resist 6 as a mask. The energy of ion implantation is adjusted so that the peak of a concentration distribution is obtained on the support substrate 3 side from the interface between the support substrate 3 and the buried insulating film 2. Referring to the relationship between the thickness of the semiconductor film 1 and the energy of ion implantation, when the thickness of the semiconductor film 1 is large, the energy of ion implantation of the second well 8 is increased, and the damage of the semiconductor film 1 during ion implantation is increased correspondingly. Furthermore, in the case where an SOI wafer is formed by ion implantation of oxygen, the thickness of the semiconductor film 1 becomes substantially the same as that of the buried insulating film 2. Therefore, the energy of ion implantation of the second well 8 is further increased. In view of this, the thickness of the semiconductor film 1 is preferably small. When the energy of ion implantation of the second well 8 is equal to or more than 500 keV, the characteristics are degraded due to the damage. Therefore the thickness of the semiconductor film 1 is desirably equal to or smaller than 3000 Å.

Figure 2A:
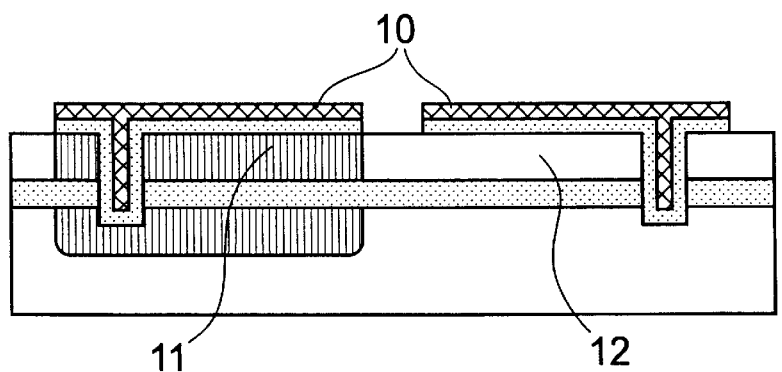
FIGS. 2A to 2D are views illustrating a process flow of the manufacturing method of the present invention.
Figure 2B:
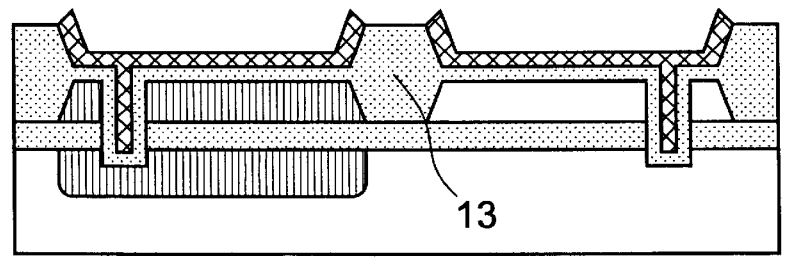

Next, the LOCOS 13 is formed. The nitride film 10 is formed to a thickness of about 1600 Å on the thermal oxide film 5 with the resist 6 removed therefrom. Then, alignment and exposure to light are conducted, and the LOCOS 13 is patterned. The nitride film 10 is etched to form a LOCOS formation portion (FIG. 2A). FIG. 2A shows the state where masks of the thermal oxide film 5 and the nitride film 10 are formed on a P-type transistor region 11 and an N-type transistor region 12. The resultant wafer is placed in a thermal oxidation furnace, and the LOCOS 13 is formed as shown in FIG. 2B. The thickness of the LOCOS 13 is set so that the LOCOS 13 reaches the buried insulating film 2 on the support substrate 3. Herein, the well 7 and the second well 8 are activated simultaneously during this thermal oxidation. After the LOCOS 13 is formed, the nitride film 10 is removed, and the oxide film in the portion other than the LOCOS 13 is removed, whereby oxidation of a gate is conducted.

Figure 2C:
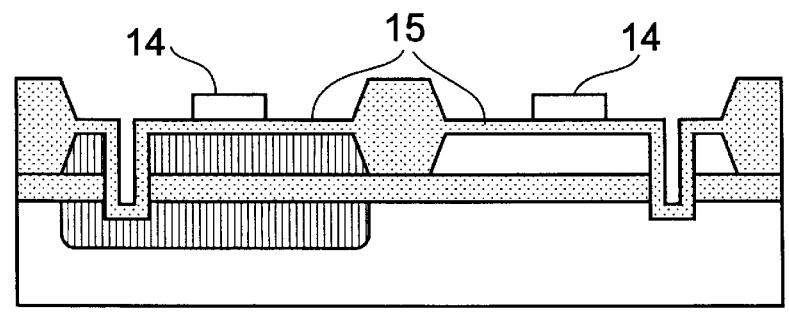

The subsequent process proceeds in the same way as in the ordinary manufacturing process of a CMOS. As shown in FIG. 2C, after polysilicon is formed, alignment and exposure to light are conducted, and a gate electrode 14 is patterned. Then, polysilicon is etched by dry etching to form a gate electrode 14. Then, polysilicon is oxidized, ion implantation of N-type and P-type source/drain regions is conducted, and an interlayer insulating film 35 is formed.

Figure 2D:
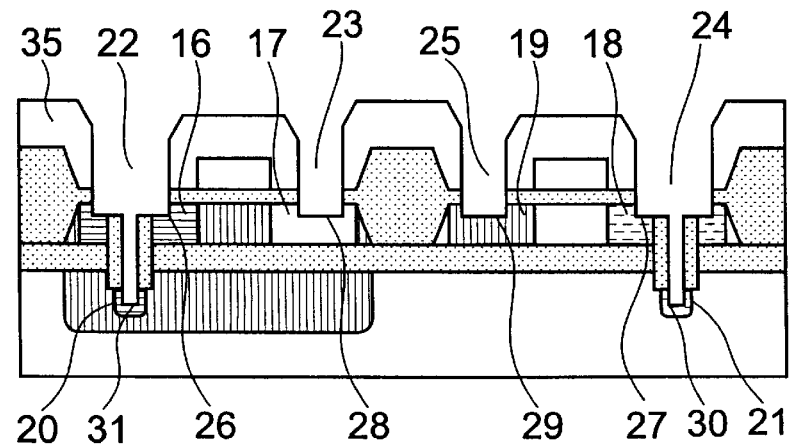

Then, contacts of source/drain regions of a transistor are formed. As shown in FIG. 2D, a resist is applied to the interlayer insulating film 35, and alignment and exposure to light are conducted, whereby patterning and etching of the contacts are conducted. There are two kinds of contacts according to the present invention. One is for taking the potential from the source/drain regions in the same way as in the contacts of source/drain regions of a general transistor. The other one is a source-body-tie contact. The source-body-tie contact of the present invention simultaneously takes the potential of the source-body-tie regions 16, 18 and the potential of the support substrate 3 (or second well 8).

The same contacts as those of the source/drain regions of a general transistor are formed by etching the interlayer insulating film 35 and the gate oxide film 15 to a part of the semiconductor film 1, as shown in FIG. 2D. Therefore, a drain region 17 of the P-type transistor is connected to a contact 23 at a connecting portion 28, and a drain region 19 of the N-type transistor is connected to a contact 25 at a connecting portion 29, as shown in FIG. 2D. Although not shown in FIG. 2D, a source region 41 of the P-type transistor is connected to a contact at a connecting portion 43, and a source region 42 of the N-type transistor is connected to a contact at a connecting portion 44.

On the other hand, the contact for simultaneously taking the potential of the source-body-tie regions 16, 18 and the potential of the support substrate 3 (or the second well 8) is positioned so as to surround the contact hole 4 and has a size larger than that of the contact hole 4. Because of this, a contact 22 of the P-type transistor shown in FIG. 2D is connected to the source-body-tie region 16 at a connecting portion 26, and is connected to the second well 8 via an N-type diffusion region 20 and a connecting portion 31. Furthermore, the contact 24 of the N-type transistor is connected to the source-body-tie region 18 at a connecting portion 27, and is connected to the support substrate 3 via a P-type diffusion region 21 and a connecting portion 30. The present invention is characterized as follows. Since the contact of the source-body-tie region is positioned so as to surround the contact hole 4 and has a size larger than that of the contact hole 4, the potentials of the source regions 41, 42 of a transistor, a body region thereof, and the support substrate 3 (or second well 8) can be made the same.

Figure 3:
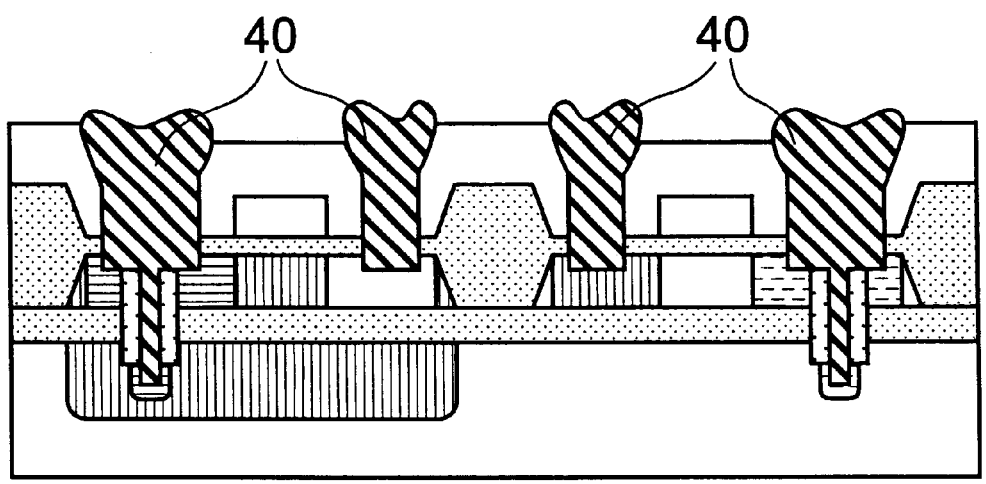
FIG. 3 is a view illustrating a process flow of the manufacturing method of the present invention.

Next, as shown in FIG. 3, metal is formed, a resist is applied, and alignment and exposure to light are conducted, whereby patterning and etching of wiring are performed. Thereafter, a protective film is formed on the wiring, and a bonding pad is formed to complete a semiconductor integrated circuit.

According to the present invention, the thickness of the semiconductor film 1 on the insulating film is set to be 200 Å to 3000 Å. The reason for this is as follows. In the above-mentioned process, an oxide film with a thickness of about 300 Å is formed by thermal oxidation. Therefore, in order to form a MOS transistor on the semiconductor film 1, it is required that the thickness of the semiconductor film 1 is at least 200 Å. On the other hand, if the semiconductor film 1 is thick, the energy of ion implantation of the second well 8 is increased, which correspondingly increases the damage of the semiconductor film 1 due to the ion implantation. Therefore, the thickness of the semiconductor film 1 is about 3000 Å.

By using the above-mentioned manufacturing method, the potentials of the source regions 41, 42 of a transistor, the body regions thereof, and the support substrate 3 (or the second well 8) can be made the same easily. In particular, by limiting the order of processes (formation of contact holes→thermal oxidation), the contact holes 4 can be formed without giving any damage to the semiconductor film 1 and the support substrate 3. Furthermore, the contact holes 4 are formed simultaneously with imprinting of alignment marks. Therefore, the number of processes is decreased.

Furthermore, by making the potentials of the source region of a transistor, the body region thereof, and the support substrate 3 (or the second well 8), a back gate voltage is not applied to each transistor. This eliminates the inconvenience that the threshold value of each transistor fluctuates due to the fluctuation of a power source voltage to change timing of a circuit and to vary a driving ability. In a voltage regulator and a voltage detector, in particular, the above structure eliminates the inconvenience that an output voltage fluctuates due to the fluctuation of a power source voltage, and a detection voltage fluctuates.

Furthermore, in the SOI transistor from a structural view, there is a transistor in which a support substrate is considered as a gate electrode, and a buried insulating film is considered as a gate oxide film. Therefore, when a power source voltage is increased, a channel is formed at the interface of a semiconductor film and a buried insulating film, which disadvantageously allows a current to flow therethrough. However, in the SOI transistor according to the present invention, a back gate voltage is not applied, which eliminates the inconvenience that when a power source voltage is increased, a channel is formed at the interface of a semiconductor film and a buried insulating film, allowing a current to flow therethrough.

Furthermore, in the SOI transistor according to the present invention, a through-contact to a support substrate is provided in a source-body-tie region. Therefore, the area of an SOI device can be effectively reduced.

The present invention is carried out in the embodiment as described above and has the following effects.

The method of manufacturing a semiconductor invention integrated circuit according to the present in which a CMOS transistor is formed on a semiconductor film of a first conductivity provided on a support substrate of a first conductivity via a buried insulating film includes:

forming a contact hole in a source-body-tie region adjacent to a body region under a source region and a gate region of a transistor so that the contact hole reaches a part of the support substrate through the semiconductor film and the buried insulating film on the support substrate, together with alignment marks;

forming a thermal oxide film on an inner side of the contact hole on the semiconductor film;

forming an impurity region of a second conductivity in a region where a transistor of a first conductivity is to be formed, which reaches the buried insulating film on the semiconductor film;

forming an impurity region of a second conductivity in a portion on the support substrate and opposing the impurity region of a second conductivity with respect to the insulating film;

forming a gate oxide film, a gate electrode, a source region, and a drain region after separating elements, and forming an interlayer insulating film;

forming contacts of the source region and the drain region, and simultaneously, etching the interlayer insulating film so as to be concentric with the contact hole and to have a size surrounding the contact hole; and forming wiring on the interlayer insulating film.

As a result, in a transistor formed on a semiconductor film, the potential of a source region and the potential on a support substrate side at a position opposing the transistor with respect to a buried insulating film become the same. Therefore, a transistor of a first conductivity and a transistor of a second conductivity are not supplied with a back gate voltage. This eliminates the inconvenience that a threshold voltage fluctuates due to the fluctuation of a power source voltage, a timing of a circuit is changed, and a driving ability is varied. In a voltage regulator and a voltage detector, in particular, this structure eliminates the inconvenience that an output voltage fluctuates due to the fluctuation of a power source voltage, and a detection voltage fluctuates.

Furthermore, in the SOI transistor from a structural view, there is a transistor in which a support substrate is considered as a gate electrode, and a buried insulating film is considered as a gate oxide film. Therefore, in a P-type transistor supplied with a back gate voltage as in an inverter circuit in the above example, when a power source voltage is increased, a channel is formed at the interface of a semiconductor film and a buried insulating film, which disadvantageously allows a current to flow therethrough. However, in the SOI transistor according to the present invention, a back gate voltage is not applied. This structure eliminates the inconvenience that when a power source voltage is increased, a channel is formed at the interface of a semiconductor film and a buried insulating film, which disadvantageously allows a current to flow therethrough.

Furthermore, in the SOI transistor according to the present invention, a through-contact to a support substrate is provided in a source-body-tie region. Therefore, the area of an SOI device can be effectively reduced. Furthermore, a through-contact according to the present invention is formed simultaneously with the formation of an alignment mark. Therefore, compared with the conventional process of forming a through-contact to a support substrate, there is an effect of reducing the number of processes.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of manufacturing a semiconductor integrated circuit in which a CMOS transistor is formed on a semiconductor film of a first conductivity provided on a support substrate of a first conductivity via a buried insulating film, comprising:

forming a contact hole in a source-body-tie region adjacent to a body region under a source region and a gate region of a transistor so that the contact hole reaches a part of the support substrate through the semiconductor film and the buried insulating film on the support substrate, together with alignment marks;

forming a thermal oxide film on an inner side of the contact hole on the semiconductor film;

forming an impurity region of a second conductivity in a region where a transistor of a first conductivity is to be formed, which reaches the buried insulating film on the semiconductor film;

forming an impurity region of a second conductivity in a portion on the support substrate and opposing the impurity region of a second conductivity with respect to the insulating film;

forming a gate oxide film, a gate electrode, a source region, and a drain region after separating elements, and forming an interlayer insulating film;

forming contacts of the source region and the drain region, and simultaneously, etching the interlayer insulating film so as to be concentric with the contact hole and to have a size surrounding the contact hole; and forming wiring on the interlayer insulating film.

2. A method of manufacturing a semiconductor integrated circuit according to claim 1, wherein a thickness of the semiconductor film is in a range of 200 Å to 3000 Å.

* * * * *